United States Patent
Xu et al.

(10) Patent No.: US 11,290,131 B2
(45) Date of Patent: Mar. 29, 2022

(54) BIT ERROR DETECTION METHOD AND APPARATUS

(71) Applicant: Huawei Technologies Co., Ltd., Shenzhen (CN)

(72) Inventors: Li Xu, Shenzhen (CN); Qiwen Zhong, Shenzhen (CN); Min Zha, Shenzhen (CN); Rixin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/911,979

(22) Filed: Jun. 25, 2020

(65) Prior Publication Data
US 2020/0328760 A1     Oct. 15, 2020

Related U.S. Application Data

(63) Continuation of application No. PCT/CN2018/122950, filed on Dec. 22, 2018.

(30) Foreign Application Priority Data

Dec. 27, 2017   (CN) .......................... 201711449728.2

(51) Int. Cl.
    *H03M 13/27*     (2006.01)
    *H03M 13/09*     (2006.01)
    *H04L 1/00*     (2006.01)

(52) U.S. Cl.
CPC ....... *H03M 13/2778* (2013.01); *H03M 13/09* (2013.01); *H04L 1/0061* (2013.01)

(58) Field of Classification Search
CPC ... H04L 1/242; H04L 43/0847; H04L 1/0061; H04L 1/203; H04L 43/062; H04L 1/0045; H03M 13/09; H03M 13/2778
See application file for complete search history.

(56) References Cited

U.S. PATENT DOCUMENTS 5,764,651 A     6/1998   Bullock et al.
5,784,388 A *   7/1998   Knox .................... H03M 13/27
                                                 714/748
(Continued)

FOREIGN PATENT DOCUMENTS

CN          1852163 A     10/2006
CN       101488817 A      7/2009
(Continued)

OTHER PUBLICATIONS

ITU-T, "Interfaces for the Optical Transport Network (OTN), Amendment 3", ITU-T Recommendation G.709/6.1331, Sep. 29, 2010, 61 pages.

(Continued)

*Primary Examiner* — Guy J Lamarre
(74) *Attorney, Agent, or Firm* — Slater Matsil, LLP

(57) ABSTRACT

A method includes: receiving a first result obtained by performing BIP check on a sent first to-be-checked bit stream; performing BIP check on a received second to-be-checked bit stream to obtain a second result, where the second to-be-checked bit stream is a bit stream received by a receiving device after the first to-be-checked bit stream is transmitted; detecting a type of a control block in the second to-be-checked bit stream, and determining a third result based on impact of the type of the control block on a BIP check result; comparing the first result, the second result, and the third result; and if the first result is different from the second result, the first result is different from the third result, and the second result is different from a predetermined result, determining that a bit error occurs when the first to-be-checked bit stream is transmitted.

20 Claims, 11 Drawing Sheets

(56) References Cited

U.S. PATENT DOCUMENTS

| | | | |
|---|---|---|---|
| 6,751,769 B2* | 6/2004 | Chen | G06F 11/1016 |
| | | | 714/767 |
| 2001/0015844 A1* | 8/2001 | Takehana | H04L 1/20 |
| | | | 398/178 |
| 2012/0047419 A1 | 2/2012 | Shinya | |
| 2015/0106668 A1* | 4/2015 | Ran | H04L 1/203 |
| | | | 714/704 |
| 2016/0241257 A1* | 8/2016 | Winstead | H03M 13/1108 |
| 2016/0373138 A1 | 12/2016 | Li et al. | |
| 2017/0005901 A1 | 1/2017 | Gareau et al. | |
| 2017/0104655 A1* | 4/2017 | Takahashi | H04L 49/102 |
| 2019/0115938 A1* | 4/2019 | Eroz | H03M 13/116 |

FOREIGN PATENT DOCUMENTS

| | | |
|---|---|---|
| CN | 102291408 A | 12/2011 |
| CN | 103780423 A | 5/2014 |
| CN | 105790882 A | 7/2016 |
| CN | 106817192 A | 6/2017 |
| JP | 2009164905 A | 7/2009 |
| JP | 2012044574 A | 3/2012 |
| WO | 2017192072 A1 | 11/2017 |

OTHER PUBLICATIONS

IEEE Computer Society, "IEEE Standard for Ethernet," IEEE Std 802.Mar. 2015 (Revision of IEEE Std 802.3-2012), Sep. 3, 2015, 4017 pages.

* cited by examiner

BIT ERROR DETECTION METHOD AND APPARATUS

CROSS-REFERENCE TO RELATED APPLICATIONS

This application is a continuation of International Application No. PCT/CN2018/122950, filed on Dec. 22, 2018, which claims priority to Chinese Patent Application No. 201711449728.2, filed on Dec. 27, 2017. The disclosures of the aforementioned applications are hereby incorporated by reference in their entireties.

TECHNICAL FIELD

The present invention relates to the field of Ethernet technologies, and in particular, to a bit error detection method and apparatus.

BACKGROUND

Error performance of a physical layer in a digital communications device is an important factor and indicator in determining digital network transmission quality. The ITU-Telecommunication standardization sector (ITU-T) enacted a plurality of recommendations about error parameters and target values, including defining a block error detection principle in which an error detection code (EDC) is inserted into a tested channel. Bit interleaving parity (BIP) is an EDC for performing bit-level link error monitoring. BIP-8 is one of the commonly used EDCs. The BIP-8 groups all checked parts of a bit stream of a user per eight bits, to form a series of code groups of 8-bit sequences. For each code group of an 8-bit sequence, one 8-bit monitoring code is generated to perform checking protection on the code group. Usually, a single bit error occurring in the code group of the 8-bit sequence on which BIP calculation is performed once is considered as an error of the code group. A bit error rate (BER) refers to a ratio of a total quantity of error bits in a bit stream to a quantity of received bits in a time period. Even if errors have occurred at a plurality of bits in one checked code block, the BIP-8 can merely detect that a transmission error occurs at a single bit in the checked code block.

In a current technology, a sending device performs BIP-8 check on a segment of a bit stream, and inserts a result into the bit stream and transmits the bit stream to a receiving device. After receiving the segment of the bit stream, the receiving device performs BIP-8 check again on the segment of the bit stream and compares a result with a received BIP-8 result. BER calculation and link quality evaluation are performed based on whether the result is consistent with the received BIP-8 result. Because no operation of adding or deleting a code block for a bit stream is performed on an existing IEEE 802.3 Ethernet physical interface, a conventional BIP-8 method is applicable to bit error collection. However, for an end-to-end service of flexible Ethernet (FLexE) or a technical system based on exchange of bit blocks at an Ethernet physical layer (X-Ethernet, X-E), addition or deletion of a block may cause inconsistency between a BIP check result obtained by the receiving device and a BIP check result sent by the sending device, and it may be considered by mistake that a bit error occurs. Therefore, a conventional method for BIP bit error detection and collection is no longer applicable.

SUMMARY

A technical problem to be resolved in embodiments of this application is to provide a bit error detection method and apparatus, so as to resolve a problem of insufficient applicability and accuracy in current BIP bit error detection.

According to a first aspect, an embodiment of this application provides a bit error detection method, including: receiving a first result obtained by a sending device by performing BIP check on a sent first to-be-checked bit stream; performing BIP check on a received second to-be-checked bit stream to obtain a second result, where the second to-be-checked bit stream is a bit stream received by a receiving device after the first to-be-checked bit stream is transmitted; detecting a type of a control block in the second to-be-checked bit stream, and determining a third result based on impact of the type of the control block on a BIP check result; comparing the first result, the second result, and the third result; and if the first result is different from the second result, the first result is different from the third result, and the second result is different from a predetermined result, determining that a bit error occurs when the first to-be-checked bit stream is transmitted.

In a possible implementation, the method further includes: if an invalid block or an error block is detected in the second to-be-checked bit stream, determining that a bit error occurs when the first to-be-checked bit stream is transmitted.

In a possible implementation, the type of the control block includes a local fault block, a remote fault block, an idle block, and a low power idle block.

In a possible implementation, the predetermined result is 00000000 or 01010010 if it is detected that the type of the control block in the second to-be-checked bit stream is the local fault block and the second to-be-checked bit stream is consecutive local fault blocks.

In a possible implementation, the predetermined result is 00000000 or 10010010 if it is detected that the type of the control block in the second to-be-checked bit stream is the remote fault block and the second to-be-checked bit stream is consecutive remote fault blocks.

In a possible implementation, the determining a third result based on impact of the type of the control block on a BIP check result includes: if it is detected that the type of the control block in the second to-be-checked bit stream is the local fault block and a quantity of local fault blocks is 1, reversing bit values at the second, fourth, and seventh bit positions in the second result to obtain the third result.

In a possible implementation, the determining a third result based on impact of the type of the control block on a BIP check result includes: if it is detected that the type of the control block in the second to-be-checked bit stream is the remote fault block and a quantity of remote fault blocks is 1, reversing bit values at the first, fourth, and seventh bit positions in the second result to obtain the third result.

In a possible implementation, the determining a third result based on impact of the type of the control block on a BIP check result includes: if it is detected that the type of the control block in the second to-be-checked bit stream is the idle block or the low power idle block, reversing bit values at the second, third, fourth, and fifth bit positions in the second result to obtain the third result.

In a possible implementation, the method further includes: receiving a first parity value collected by the sending device, where the first parity value indicates a quantity of blocks in the first to-be-checked bit stream; collecting a quantity of blocks in the received second to-be-checked bit stream and generating a second parity value; and if the first result is the same as the third result and the first parity value is the same as the second parity value, determining that a bit error occurs when the first to-be-checked bit stream is transmitted.

In a possible implementation, after the determining that a bit error occurs when the first to-be-checked bit stream is transmitted, the method further includes: accumulating a quantity of bit errors occurring in a preset time period, and calculating a bit error rate based on a total quantity of bit errors accumulated in the preset time period and a total quantity of received bits.

In a possible implementation, the method further includes: sending the total quantity of bit errors or the bit error rate to the sending device.

According to a second aspect, an embodiment of this application provides a bit error detection apparatus, including: a transceiver unit, configured to receive a first result obtained by a sending device by performing BIP check on a sent first to-be-checked bit stream; and a processing unit, configured to: perform BIP check on a received second to-be-checked bit stream to obtain a second result, where the second to-be-checked bit stream is a bit stream received by a receiving device after the first to-be-checked bit stream is transmitted; detect a type of a control block in the second to-be-checked bit stream, and determine a third result based on impact of the type of the control block on a BIP check result; compare the first result, the second result, and the third result; and if the first result is different from the second result, the first result is different from the third result, and the second result is different from a predetermined result, determine that a bit error occurs when the first to-be-checked bit stream is transmitted.

In a possible implementation, the processing unit is further configured to: if an invalid block or an error block is detected in the second to-be-checked bit stream, determine that a bit error occurs when the first to-be-checked bit stream is transmitted.

In a possible implementation, the type of the control block includes a local fault block, a remote fault block, an idle block, and a low power idle block.

In a possible implementation, the predetermined result is 00000000 or 01010010 if the processing unit detects that the type of the control block in the second to-be-checked bit stream is the local fault block and the second to-be-checked bit stream is consecutive local fault blocks.

In a possible implementation, the predetermined result is 00000000 or 10010010 if it is detected that the type of the control block in the second to-be-checked bit stream is the remote fault block and the second to-be-checked bit stream is consecutive remote fault blocks.

In a possible implementation, that the processing unit determines a third result based on impact of the type of the control block on a BIP check result is specifically configured to: if it is detected that the type of the control block in the second to-be-checked bit stream is the local fault block and a quantity of local fault blocks is 1, reverse bit values at the second, fourth, and seventh bit positions in the second result to obtain the third result.

In a possible implementation, that the processing unit determines a third result based on impact of the type of the control block on a BIP check result is specifically configured to: if it is detected that the type of the control block in the second to-be-checked bit stream is the remote fault block and a quantity of remote fault blocks is 1, reverse bit values at the first, fourth, and seventh bit positions in the second result to obtain the third result.

In a possible implementation, that the processing unit determines a third result based on impact of the type of the control block on a BIP check result is specifically configured to: if it is detected that the type of the control block in the second to-be-checked bit stream is the idle block or the low power idle block, reverse bit values at the second, third, fourth, and fifth bit positions in the second result to obtain the third result.

In a possible implementation, the transceiver unit is further configured to receive a first parity value collected by the sending device, where the first parity value indicates a quantity of blocks in the first to-be-checked bit stream; and the processing unit is further configured to: collect a quantity of blocks in the received second to-be-checked bit stream and generate a second parity value; and if the first result is the same as the third result and the first parity value is the same as the second parity value, determine that a bit error occurs when the first to-be-checked bit stream is transmitted.

In a possible implementation, after the processing unit determines that a bit error occurs when the first to-be-checked bit stream is transmitted, the processing unit is further configured to: accumulate a quantity of bit errors occurring in a preset time period, and calculate a bit error rate based on a total quantity of bit errors accumulated in the preset time period and a total quantity of received bits.

In a possible implementation, the transceiver unit is further configured to: send the total quantity of bit errors or the bit error rate to the sending device.

According to a third aspect, an embodiment of this application provides a bit error detection apparatus, including: a processor, a memory, an interface circuit, and a bus, where the processor, the memory, and the interface circuit are connected and communicate with each other by using the bus; the memory is configured to store a set of program code; and the processor is configured to invoke the program code stored in the memory, to perform the steps according to any one of the first aspect or the implementations of the first aspect in the embodiments of this application.

According to a fourth aspect, an embodiment of this application provides a computer storage medium, where the computer storage medium includes a set of program code, which is used to perform the method according to any implementation of the first aspect in the embodiments of this application.

BRIEF DESCRIPTION OF THE DRAWINGS

To describe the technical solutions in the embodiments of this application more clearly, the following briefly describes the accompanying drawings required for describing the embodiments.

FIG. 6 is a schematic diagram of a check result obtained after bit reversal due to addition or deletion of a local fault block/a remote fault block;

FIG. 11 is a schematic diagram of a format of a local fault block;

FIG. 12 is a schematic diagram of a format of a remote fault block;

FIG. 13 is a schematic diagram of a format of an idle block; and

FIG. 14 is a schematic diagram of a format of a low power idle block.

DETAILED DESCRIPTION OF ILLUSTRATIVE EMBODIMENTS

Figure 1:
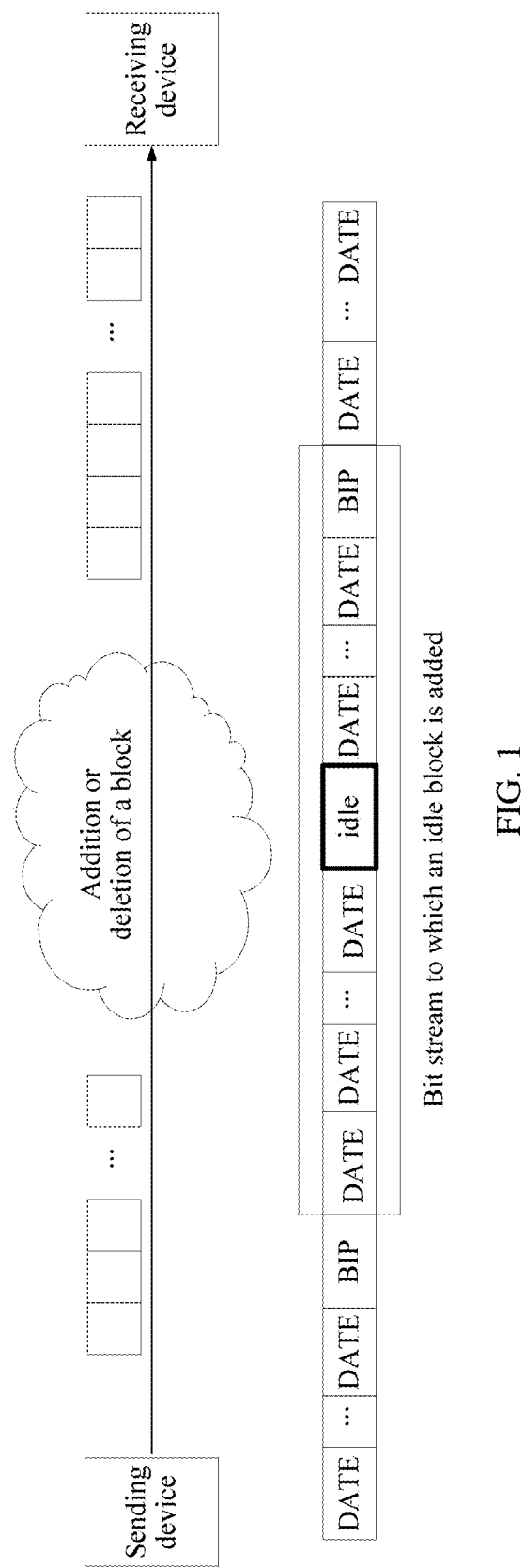
FIG. 1 is a schematic diagram of an application scenario of bit error detection according to an embodiment of this application.

The following clearly describes the technical solutions in the embodiments of this application with reference to the accompanying drawings in the embodiments of this application. Apparently, the described embodiments are merely some but not all of the embodiments of this application. All other embodiments obtained by a person of ordinary skill in the art based on the embodiments of this application without creative efforts shall fall within the protection scope of this application.

Some concepts related to the embodiments of this application are first described.

M/N bit block: M-bit user data, an N-bit (M+several synchronous bits) coding/decoding method, and a block. This M/N bit block stream is transmitted on an Ethernet physical layer link. For example, 1G Ethernet (1GE) uses 8/10 bit coding, and an 8/10 bit block stream is transmitted on a 1GE physical layer link; 10GE/40GE/100GE uses 64/66 bit coding, and a 64/66 bit block stream is transmitted on a 10GE/40GE/100GE physical layer link. As Ethernet technologies will develop in the future, other coding/decoding methods may appear. For example, possible coding/decoding schemes such as a 128/130 bit coding, 256/258 bit coding, and a block may appear.

BIPs: A BIPs represents a value of a BIP check result obtained by a sending device by performing BIP check on a segment of a bit stream, and the BIPs is sent to a receive end by the sending device.

BIPd: A BIPd represents a value of a BIP check result obtained by the receiving device by performing BIP check again on the received bit stream on which the sending device performs BIP check.

Numr: A Numr represents parity of a total quantity of blocks in a segment of a bit stream on which the sending device performs BIP check, where 0 represents an even quantity and 1 represents an odd quantity.

Numc: A Numc represents parity of a total quantity of blocks in a bit stream that is received by the receiving device and on which the sending device performs BIP check, where 0 represents an even quantity and 1 represents an odd quantity.

Ethernet local fault (Local False, LF)/remote fault (Remote False, RF) block: 64/66 bit block coding formats of the LF block and the RF block are respectively as follows.

Figures 11, 12, 13, 14:
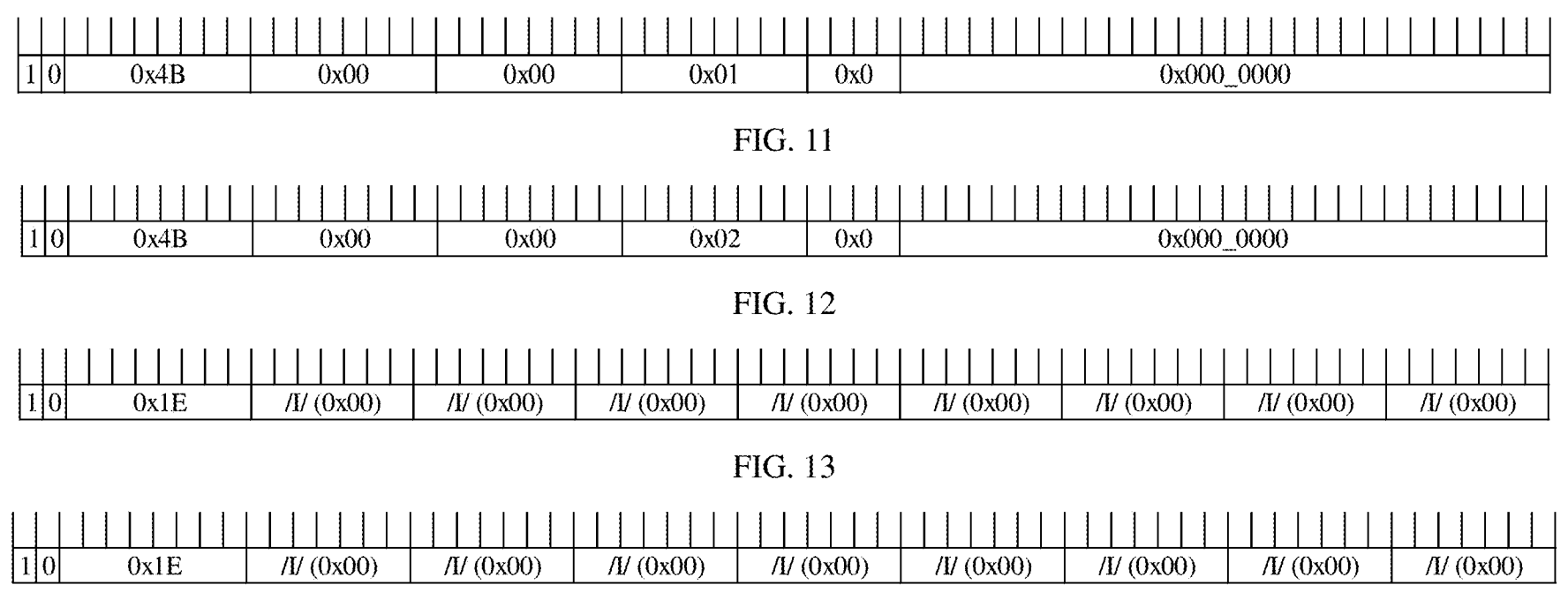

The LF block shown in FIG. 11: The LF block is a type of the 64/66 bit block, where a synchronization header field is 10, a byte of a first control block is 0x4B, a fourth control block is 0x01, and the following four consecutive 8-bit data bits (32 bits in total) are all 0x00.

The RF block shown in FIG. 12: The RF block is a type of the 64/66 bit block, where a synchronization header field is 10, a byte of a first control block is 0x4B, a fourth control block is 0x02, and the following four consecutive 8-bit data bits (32 bits in total) are all 0x00.

The idle block shown in FIG. 13: The idle block is a type of the 64/66 bit block, where a synchronization header field is 10, a byte of a first control block is 0x1E, and the following eight consecutive 7-bit data bits (56 bits in total) are all 0x00.

The low power idle (LPI) block shown in FIG. 14: The low power idle block is a type of the 64/66 bit block, where a synchronization header field is 10, a byte of a first control block is 0x1E, and the following eight consecutive 7-bit data bits (56 bits in total) are all 0x06.

The control block in the embodiments of this application includes but is not limited to the foregoing four types of blocks. Subsequently, when there is another control block, a method similar to a method in the embodiments of this application may also be used to detect a bit error. This is not limited in the embodiments of this application.

The method in the embodiments of this application may be applied to any application network in which BIP is used to detect a bit error and evaluate link quality, such as FlexE, a synchronous digital hierarchy (SDH)/optical transport network (OTN), or an industrial Ethernet.

FIG. 1 is a schematic diagram of an application scenario of bit error detection according to an embodiment of this application. This typical application scenario includes a sending device and a receiving device.

The sending device may be configured to send data (DATE), and divide a bit stream and perform BIP check on the bit stream based on a BIP algorithm, for example, commonly seen BIP-8, BIP16, or BIP2. The BIP-8 means that a bit stream is divided and checked per segment of eight blocks, and a value of a check result of each segment of the bit stream is sent to the receiving device after BIP-8 check is performed on each segment of the bit stream. For ease of description, the BIP-8 is used as an example for description in this embodiment of this application. A detection method in this application may also be used for other BIP check methods. This is not limited in this embodiment of this application. A BIP check result calculated and sent by the sending device (BIP result calculated on the source end, BIPs) may be denoted as BIPs.

The receiving device is equipped with a bit error detection apparatus. The receiving device may receive data and perform BIP check on a received bit stream based on the BIP algorithm; compare a check result obtained by the receiving device with a received check result sent by the sending device; and determine, based on a comparison result, whether a bit error occurs in the segment of the bit stream during transmission. A BIP check result calculated by the receiving device (BIP result calculated on the receiving/destination node, BIPd) may be denoted as BIPd.

As shown in FIG. 1, a small box on a horizontal line in a transmission direction between the sending device and the receiving device represents a bit stream, a cloud represents a network, and in a process of transmission of the bit stream from the sending device to the receiving device, addition or deletion of a block may occur. For example, when a FlexE client (Client) service is mapped to a FlexE interface, an idle block needs to be added or deleted to adapt adjustment of a transmission bit rate to a slot of a carrier. Alternatively, after cross-connection based on 64/66 bit block bit streams is introduced and when the 64/66 bit block bit streams pass through networks of different clocks, for cross-connection from an inbound interface to an outbound interface on a plurality of nodes, an idle block also needs to be added or deleted to implement adjustment of a bit rate. For another example, when transmitting data, a transmit end and a receive end of a link perform real-time monitoring and dynamic adjustment on a link status by sending a block such as the LPI, the LF, and the RF.

In a conventional BIP-8 calculation method, addition or deletion of these blocks is not considered and processed, and the addition or deletion of these blocks causes inapplicability of the conventional BIP-8 check method. Therefore, a method with stronger applicability for detecting a bit error on a link and collecting a BER needs to be provided.

With reference to FIG. 2 to FIG. 6, the following describes in detail a bit error detection method in this application.

Figure 2:
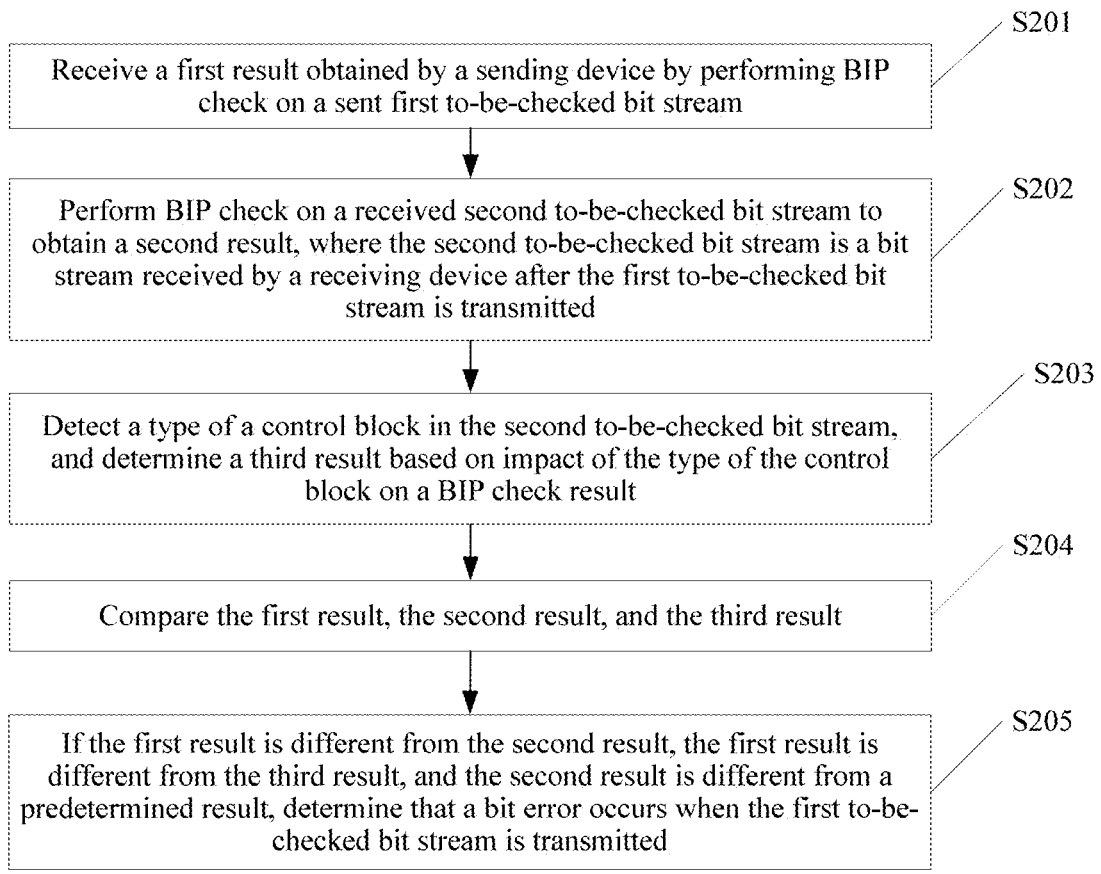
FIG. 2 is a schematic flowchart of a bit error detection method according to an embodiment of this application.

FIG. 2 is a schematic flowchart of a bit error detection method according to an embodiment of this application. In this embodiment, the method includes the following steps.

S201: Receive a first result (BIPs) obtained by a sending device by performing BIP check on a sent first to-be-checked bit stream.

S202: Perform BIP check on a received second to-be-checked bit stream to obtain a second result (BIPd).

The second to-be-checked bit stream is a bit stream received by a receiving device after the first to-be-checked bit stream is transmitted. The second to-be-checked bit stream may be the same as the first to-be-checked bit stream, and the second to-be-checked bit stream may be different from the first to-be-checked bit stream due to addition or deletion of a block during transmission.

S203: Detect a type of a control block in the second to-be-checked bit stream, and determine a third result based on impact of the type of the control block on a BIP check result.

Optionally, the type of the control block may include but is not limited to a local fault block, a remote fault block, an idle block, and a low power idle block.

Addition or deletion of each type of the control block causes a difference between the two BIP check results. Compared with the first result, impact of the control block on the second result of BIP check may include but is not limited to: causing reversal of a bit value at a predetermined bit position or causing the second result to become a predetermined result.

For example, the predetermined result is 00000000 or 01010010 if it is detected that the type of the control block in the second to-be-checked bit stream is the local fault block and the second to-be-checked bit stream is consecutive local fault blocks.

The predetermined result is 00000000 or 10010010 if it is detected that the type of the control block in the second to-be-checked bit stream is the remote fault block and the second to-be-checked bit stream is consecutive remote fault blocks.

If it is detected that the type of the control block in the second to-be-checked bit stream is the local fault block and a quantity of local fault blocks is 1, bit values at the second, fourth, and seventh bit positions in the second result are reversed to obtain the third result.

If it is detected that the type of the control block in the second to-be-checked bit stream is the remote fault block and a quantity of remote fault blocks is 1, bit values at the first, fourth, and seventh bit positions in the second result are reversed to obtain the third result.

If it is detected that the type of the control block in the second to-be-checked bit stream is the idle block or the low power idle block, bit values at the second, third, fourth, and fifth bit positions in the second result are reversed to obtain the third result.

Therefore, when addition or deletion of a block may occur, determining the bit error not only includes comparing the first result and the second result, but also includes comparing the first result and the third result, and includes comparing the second result and the predetermined result.

S204: Compare the first result, the second result, and the third result.

S205: If the first result is different from the second result, the first result is different from the third result, and the second result is different from the predetermined result, determine that a bit error occurs when the first to-be-checked bit stream is transmitted.

To be specific, if the second result is the same as the first result when no block is added or deleted, or an even quantity of idle/LPI blocks is added or deleted, it may be determined that no bit error occurs.

However, when an odd quantity of idle/LPI blocks is added or deleted and the second result may be different from the first result, a bit error may not occur in this case. In this case, the first result may be compared with the third result and if the first result is the same as the third result, it is determined that no bit error occurs.

However, when one LF/RF block is added and the second result may be different from the first result, a bit error may not occur in this case. In this case, the first result may be compared with the third result and if the first result is the same as the third result, it is determined that no bit error occurs.

However, when a to-be-checked bit stream is consecutive LF/RF blocks and the second result may be different from the first result, a bit error may not occur in this case. In this case, the second result may be compared with the predetermined result and if the second result is the same as the predetermined result, it is determined that no bit error occurs.

It can be learned from the foregoing cases that it may be determined that no bit error occurs if any of the following conditions is met: the second result is the same as the first result, the third result, or the predetermined result. If none of the three conditions is met, it is determined that a bit error occurs.

When a bit error occurs, a quantity of bit errors occurring in a preset time period, for example, 15 minutes, may be accumulated, and a bit error rate is calculated based on a total quantity of bit errors accumulated in the preset time period and a total quantity of received bits.

Optionally, the receiving device may further send the total quantity of bit errors or the bit error rate to the sending device, so that the sending device may also calculate or learn of the bit error rate.

In this embodiment, analysis and processing of addition or deletion of the control block is added to a BIP calculation process, so that the receive end may screen out a BIP check result that cannot be screened out in a conventional BIP manner and that is determined by mistake, improving applicability of the BIP check method without changing hardware implementation. In addition, this can avoid discarding a correct block and wasting bandwidth, so that link quality monitoring is more accurate and a bit error status of a link can be reflected more truly.

It should be noted that, in this embodiment of this application, a serial number of each step does not represent an execution order. For example, the type of the control block may be detected and the third result may be determined first, and then comprehensive comparison and determining are performed on each result. Alternatively, the first result may be compared with the second result first, and if the two results are the same, it is determined that no bit error occurs, and subsequent steps are no longer performed. If the first result is different from the second result, a detection step in step S203 is further performed and the third result is determined, and then the first result is compared with the third result. If the first result is the same as the third result, it is determined that no bit error occurs, and subsequent steps are no longer performed. If the first result is different from the third result, the second result may be further compared with a predetermined result. When the second result is the same as the predetermined result, it may be determined that no bit error occurs. The predetermined result may be determined based on whether the second to-be-checked bit stream is consecutive LF/RF blocks.

In addition to the foregoing comparison methods, alternatively, the control block in the second to-be-checked bit stream may be detected first, and then a theoretic third result is determined based on the impact of the control block on the first result of BIP check, and a second result obtained by the receive end through actual calculation is compared with the theoretic third result. If the second result is different from the first result and the second result is different from the third result, it is determined that a bit error occurs. If the second result is the same as the first result or the third result, it is determined that no bit error occurs. The third result includes a result obtained by reversing a predetermined bit in the first result and a predetermined result determined based on whether the second to-be-checked bit stream is consecutive LF/RF blocks. A specific comparison process and comparison method are not limited in this embodiment of this application.

The following describes in detail some possible implementations.

Figure 3A:
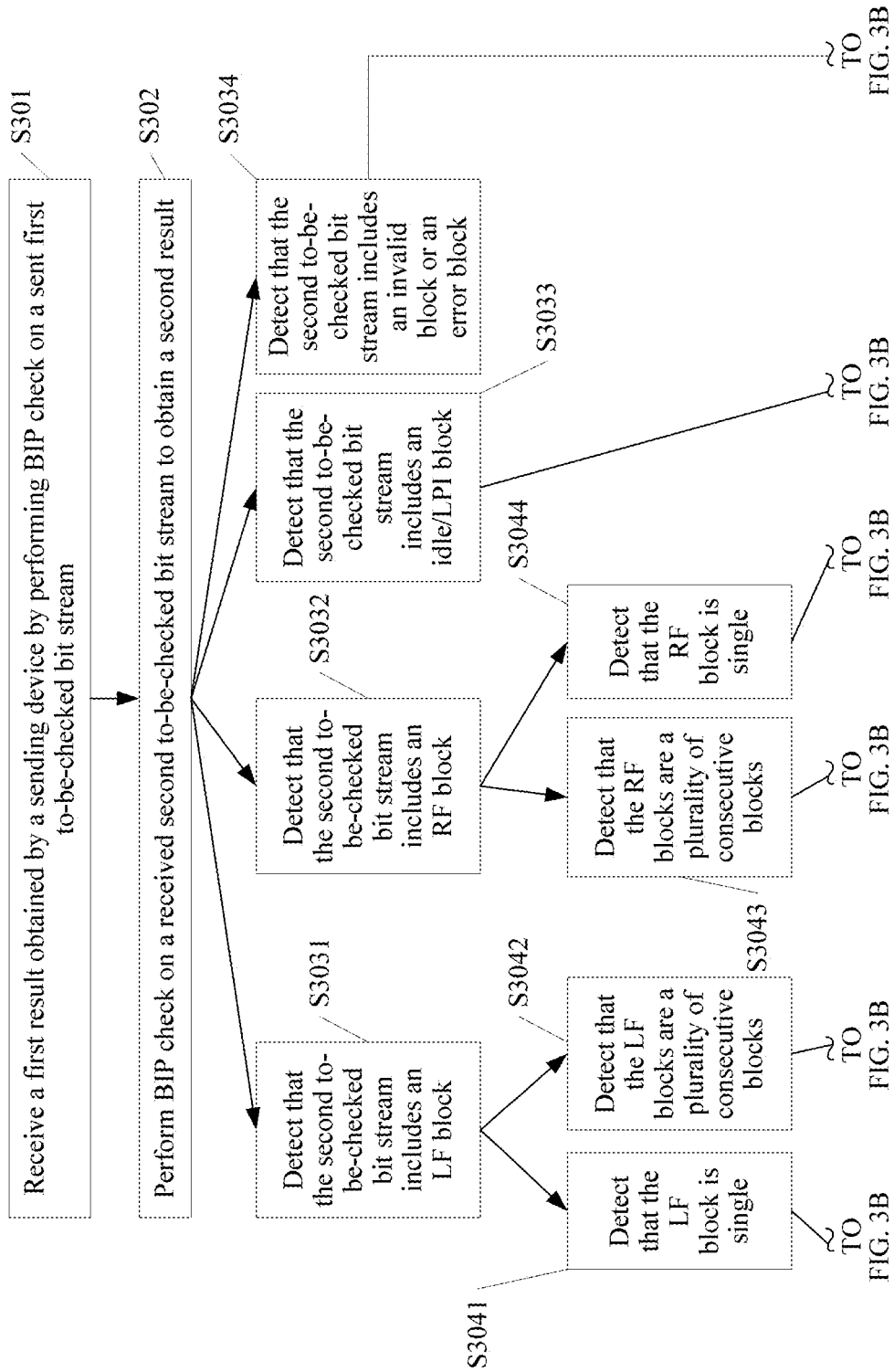
FIG. 3A and FIG. 3B are a schematic flowchart of another bit error detection method according to an embodiment of this application.
Figure 3B:
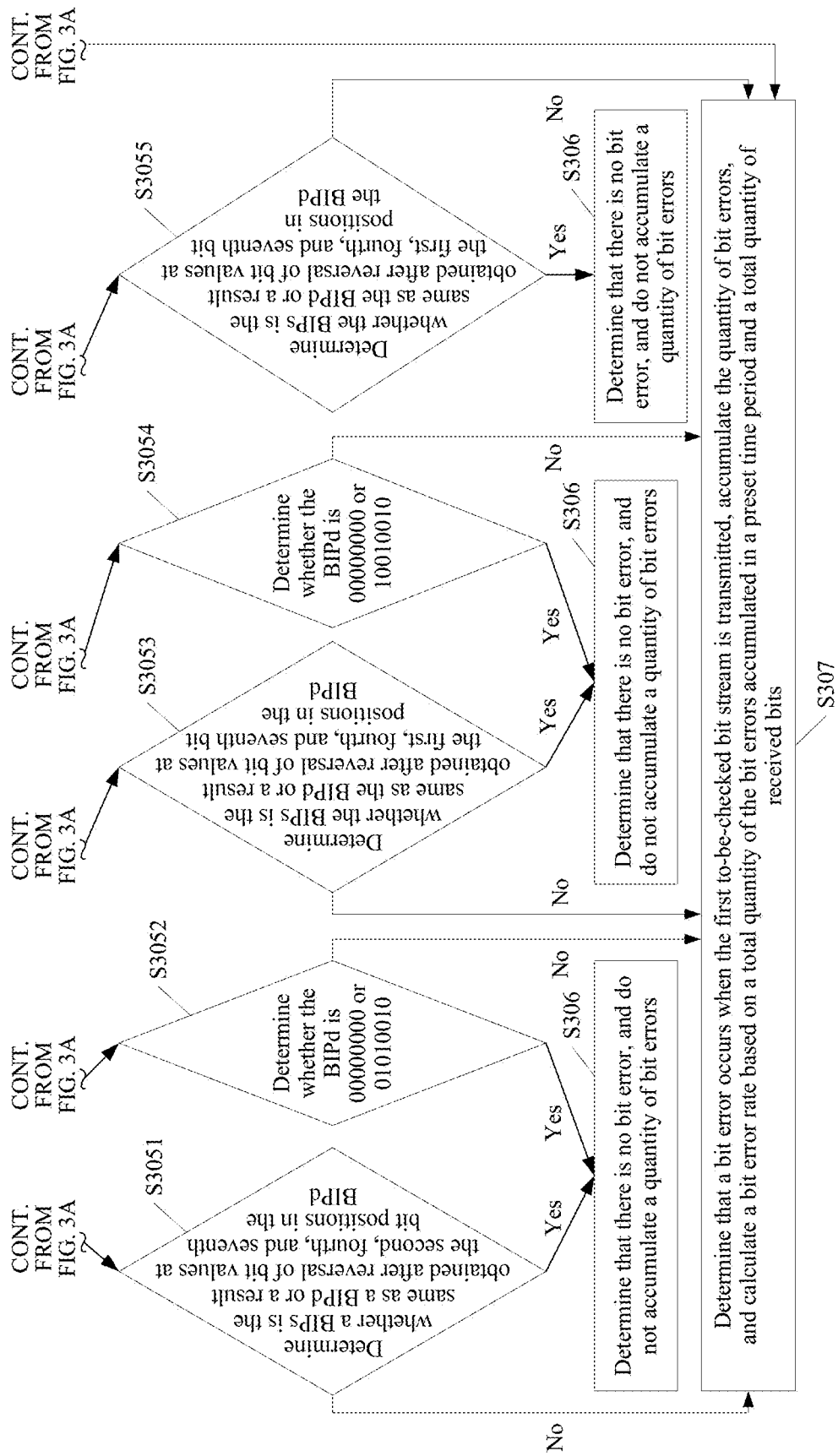
Figure 5:
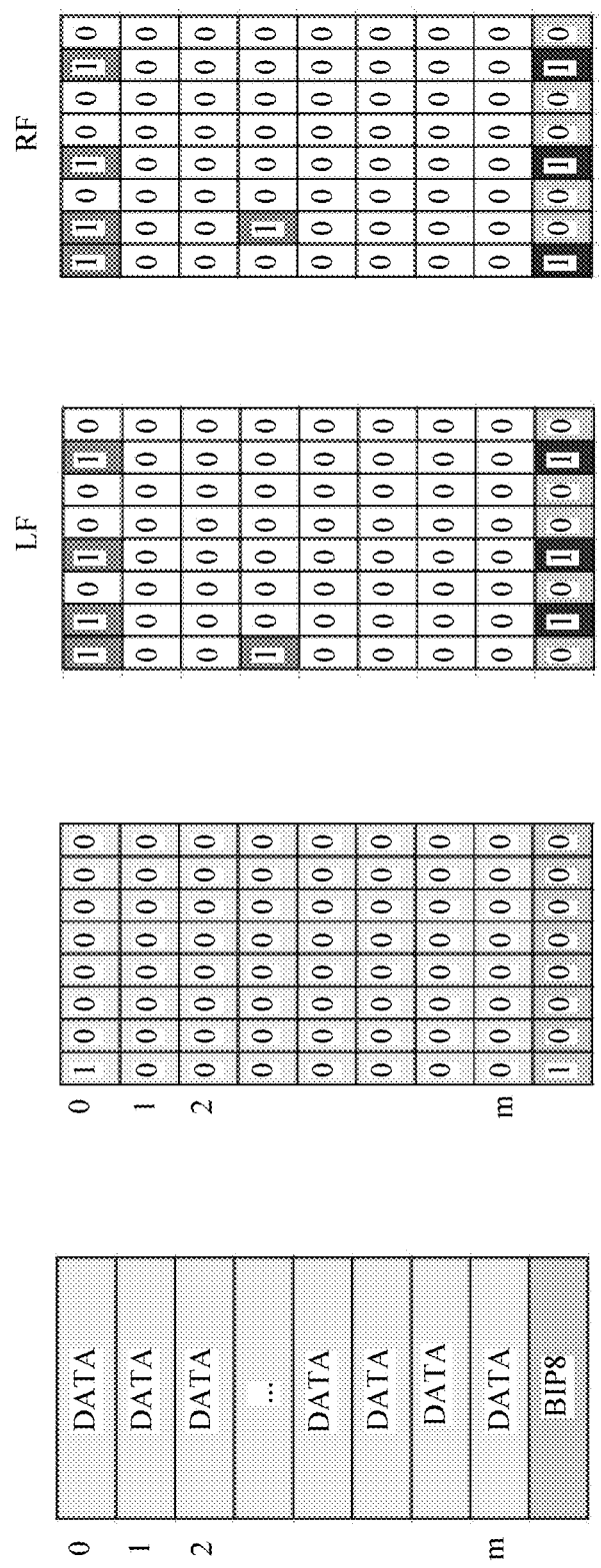
FIG. 5 is a schematic diagram of impact of a local fault block/a remote fault block on a BIP check result.
Figure 6:
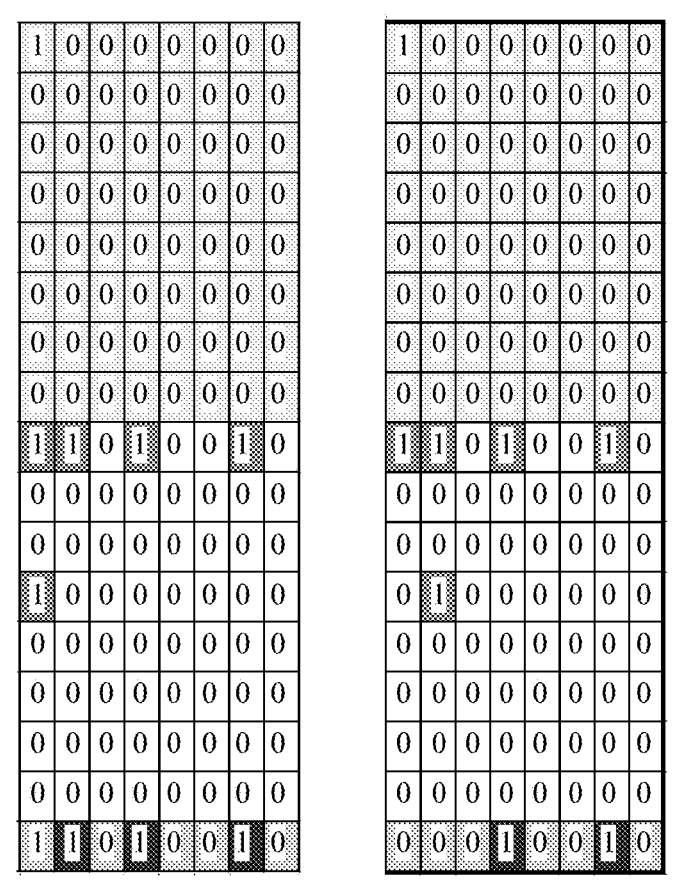
Figure 7:
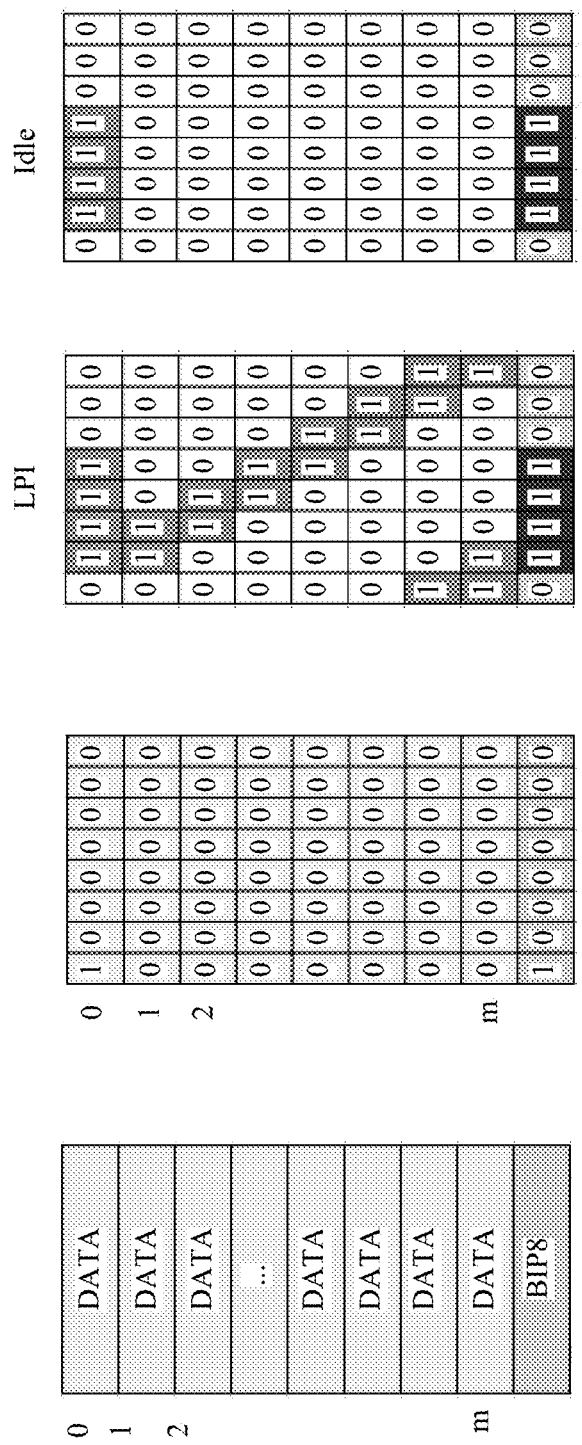
FIG. 7 is a schematic diagram of impact of an idle block/a low power idle block on a BIP check result.
Figures 8, 9:
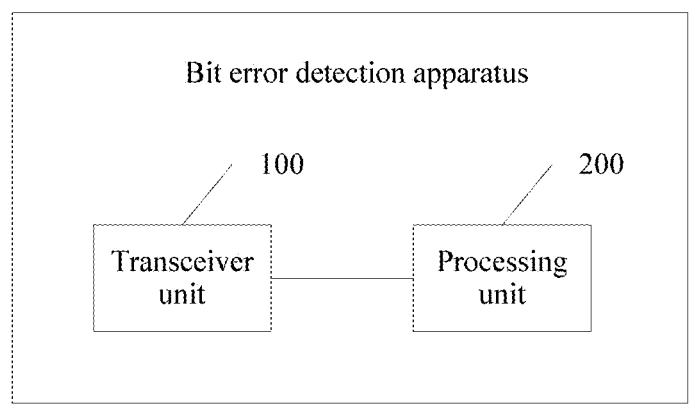
FIG. 8 is a schematic diagram of a check result obtained after bit reversal due to addition or deletion of an idle block/a low power idle block.
FIG. 9 is a schematic diagram of composition of a bit error detection apparatus according to an embodiment of this application.

FIG. 3A and FIG. 3B are a schematic flowchart of another bit error detection method according to an embodiment of this application. FIG. 5 is a schematic diagram of impact of a local fault block/a remote fault block on a BIP check result. FIG. 6 is a schematic diagram of a check result obtained after bit reversal due to addition or deletion of a local fault block/a remote fault block. FIG. 7 is a schematic diagram of impact of an idle block/a low power idle block on a BIP check result. FIG. 8 is a schematic diagram of a check result obtained after bit reversal due to addition or deletion of an idle block/a low power idle block.

For different control blocks, in this embodiment of this application, impact of addition or deletion of the idle block, the LPI block, the LF block, and the RF block on a BIP check result and bit error rate BER collection, and a corresponding processing method may be considered. When a bit error or an invalid block caused by a block other than the foregoing four types of blocks cannot pass a validity check at the receive end, and is changed into an error block, in this embodiment of this application, the invalid block or the error block is denoted as a bit error event, and bit error rate BER collection is performed. In addition, usually, once the LF block or the RF block occurs on a link, the link stops service transmission and begins transmitting consecutive LF/RF blocks. However, in one sending direction of the link, only the LF blocks or only the RF blocks are transmitted. Usually, the LF blocks and the RF blocks are not transmitted concurrently. Based on specific impact of each type of control block on a BIP-8 check result, the following more refined detection and comparison procedure may be performed. Details are as follows:

S301: Receive a first result (BIPs) obtained by a sending device by performing BIP check on a sent first to-be-checked bit stream.

S302: Perform BIP check on a received second to-be-checked bit stream to obtain a second result (BIPd), where the second to-be-checked bit stream is a bit stream received by a receiving device after the first to-be-checked bit stream is transmitted.

S3031: Detect that the second to-be-checked bit stream includes the LF block, and perform steps S3041 and S3042.

S3032: Detect that the second to-be-checked bit stream includes the RF block, and perform steps S3043 and S3044.

S3033: Detect that the second to-be-checked bit stream includes the idle/LPI block, and perform step S3055.

S3034: Detect that the second to-be-checked bit stream includes the invalid block or the error block, and perform step S307.

S3041: Detect that the LF block is single, and perform step S3051.

S3042: Detect that the LF blocks are a plurality of consecutive blocks, and perform step S3052.

S3043: Detect that the RF blocks are a plurality of consecutive blocks, and perform step S3053.

S3044: Detect that the RF block is single, and perform step S3054.

S3051: Determine whether the BIPs is the same as the BIPd or a result obtained after reversal of bit values at the second, fourth, and seventh bit positions in the BIPd. If the BIPs is the same as the BIPd or the result obtained after the reversal of the bit values at the second, fourth, and seventh bit positions in the BIPd, step S306 is performed; otherwise, step S307 is performed.

S3052: Determine whether the BIPd is 00000000 (an even quantity of LF blocks) or 01010010 (an odd quantity of LF blocks). If the BIPd is 00000000 or 01010010, step S306 is performed; otherwise, step S307 is performed.

S3053: Determine whether the BIPs is the same as the BIPd or a result obtained after reversal of bit values at the first, fourth, and seventh bit positions in the BIPd. If the BIPs is the same as the BIPd or the result obtained after the reversal of the bit values at the first, fourth, and seventh bit positions in the BIPd, step S306 is performed; otherwise, step S307 is performed.

Specifically, as shown in FIG. 5 and FIG. 6, the first figure from the left in FIG. 5 represents a data stream sequence to be checked; the second figure from the left represents a binary form in actual transmission of the data stream, and a result of BIP-8 check performed by the sending device; the first figure from the right represents a format of a single LF block in actual transmission (light gray represents a bit position having a bit value 1 in the LF block) and impact on a conventional BIP-8 check result (dark gray in the bottom line represents a position causing bit reversal in the BIPd); the second figure from the right represents a format of a single RF block in actual transmission (light gray represents a bit position having a bit value 1 in the RF block) and impact on a conventional BIP-8 check result (dark gray in the bottom line represents a position causing bit reversal in the BIPd).

As shown in FIG. 5, an original data stream is a check result BIPs, which is 10000000, of the first to-be-checked bit stream. However, an LF/RF block is added or deleted during transmission due to an actual need, and the receiving device checks the original data and the LF/RF block together, and a result is shown in FIG. 6. In FIG. 6, in the left figure, the original data and the LF block are checked together, and the check result is 11010010; to be specific, bit reversal occurs at the second, fourth, and seventh bit positions in the original check result; in the right figure, the original data and the RF block are checked together, and the check result is 00010010; to be specific, bit reversal occurs at the first, fourth, and seventh bit positions in the original check result.

Based on a conventional BIP bit error check method, addition or deletion of a block causes accumulation of a quantity m of error bits and further increases the bit error rate, and consequently, the link quality evaluation is incorrect. In addition, currently received data without a bit error is considered as error data and is discarded entirely, further causing a waste of bandwidth. Therefore, in this embodiment of this application, results obtained after reversal of bit values at predetermined bit positions in the first result and the second result may be compared, so as to improve a correctness percentage of bit error detection.

S3054: Determine whether the BIPd is 00000000 (an even quantity of RF blocks) or 10010010 (an odd quantity of RF blocks). If the BIPd is 00000000 or 10010010, step S306 is performed; otherwise, step S307 is performed.

S3055: Determine whether the BIPs is the same as the BIPd or a result obtained after reversal of bit values at the second, third, fourth, and fifth bit positions in the BIPd. If the BIPs is the same as the BIPd or the result obtained after the reversal of the bit values at the second, third, fourth, and fifth bit positions in the BIPd, step S306 is performed; otherwise, step S307 is performed.

Specifically, as shown in FIG. 7 and FIG. 8, because an M/N bit block bit stream passes through different clocks, a block such as the idle block needs to be added or deleted to implement clock synchronization (rate adaptation). The idle block causes reversal of four bits in a check result. To be specific, the idle/LPI block causes reversal of bit values at the second, third, fourth, and fifth bit positions in the BIPd, as shown in FIG. 7. The first figure from the left represents a data stream sequence to be checked, that is, the first to-be-checked bit stream; the second figure from the left represents a binary form in actual transmission of the data stream, and a result of BIP-8 check performed by the sending device; the first figure from the right represents a format of a single LPI block in actual transmission (light gray represents a bit position having a bit value 1 in the LPI block) and impact on a conventional BIP-8 check result (dark gray in the bottom line represents a position causing bit reversal in the BIPd); the second figure from the right represents a format of a single idle block in actual transmission (light gray represents a bit position having a bit value 1 in the idle block) and impact on a conventional BIP-8 check result (dark gray in the bottom line represents a position causing bit reversal in the BIPd).

As shown in FIG. 7, a check result BIPs of an original data stream is 10000000. However, an idle block is added or deleted during transmission due to a need of clock synchronization, and the receiving device checks the original data and the idle block, as shown in FIG. 8. Finally, a check result BIPd obtained by the receiving device is 11111000; to be specific, reversal of bit values occurs at the second, third, fourth, and fifth bit positions. Addition or deletion of an LPI block causes a similar situation.

This situation causes accumulation of a quantity m of error bits in bit error rate BER collection for a link, and consequently increases the bit error rate. In addition, currently received data without a bit error is considered as error data and is discarded entirely, further causing a waste of bandwidth. Therefore, in this embodiment of this application, results obtained after reversal of bit values at predetermined bit positions in the first result and the second result may be compared, so as to improve a correctness percentage of bit error detection.

S306: Determine that there is no bit error, and do not accumulate a quantity of bit errors.

S307: Determine that a bit error occurs when the first to-be-checked bit stream is transmitted, accumulate a quantity of bit errors, and calculate a bit error rate based on a total quantity of the bit errors accumulated in a preset time period and a total quantity of received bits.

For example, calculation may be performed based on the following formula:

$$EBR = (m/n) * 100\%$$

In the formula, EBR represents a bit error rate in a preset time period, m represents a quantity of bit errors occurring in the preset time period, and n represents a total quantity of received bits in the preset time period.

Optionally, the receiving device may further send a collected value of m or the EBR to the sending device.

In this embodiment, a manner of determining a bit error by the receive end is used. Different processing procedures may be performed based on different control blocks. The receive end first determines a specific type of the control block, and then performs a corresponding processing procedure. Specifically, for the control block in the second to-be-checked bit stream, the receive end first determines the type of the control block. If the control block is the LF or RF block, a procedure of determining impact of the LF or RF block on BIP-8 check is performed. If the control block is the idle or LPI block, a procedure of determining impact of the corresponding idle or LPI block on BIP-8 check is performed. If the control block is another block, the control block is determined as an invalid block, and marked as a bit error, and bit error rate BER collection is performed.

It should be noted that, with continuous development of Ethernet technologies, another new control block may appear. In this case, the method in this embodiment of this application may also be used. The new control block is not determined as an invalid block, and instead, a corresponding third result is determined by determining impact of this type of control block on a BIP check result, and the third result is compared with the first result. When the third result is the same as the first result, it is determined that no bit error occurs. This is not limited in this embodiment of this application.

Addition or deletion of a block may cause reversal of bit values at some predetermined bit positions, and further causes a difference between the BIPs and the BIPd. However, considering a possibility of a plurality of bit errors that actually occur on a link, an actually generated bit error may also cause the foregoing result. Therefore, it may be further determined that the difference between the BIPs and the BIPd is caused by addition or deletion of a block, or caused by the actually generated bit error.

Figure 4:
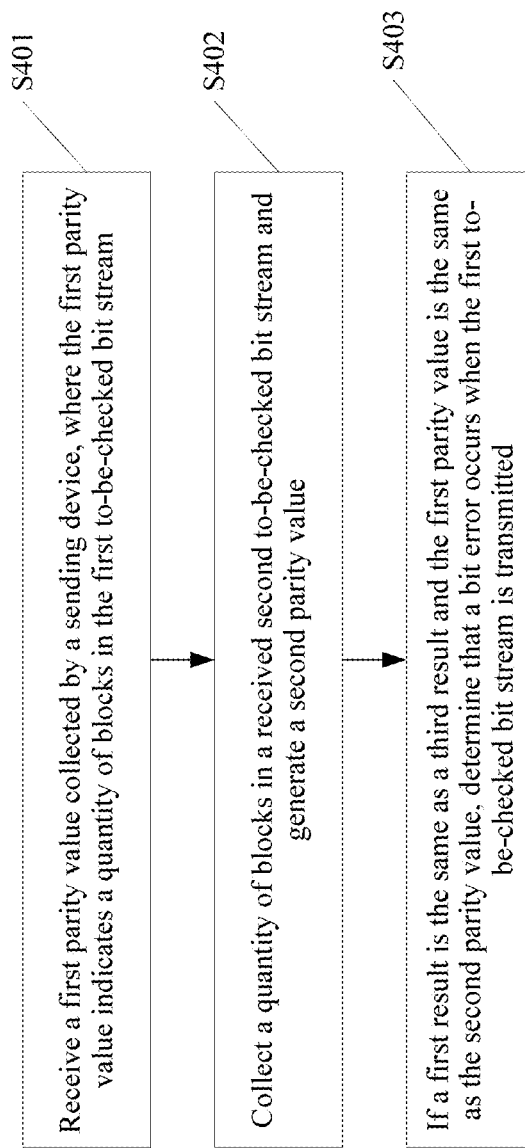
FIG. 4 is a schematic flowchart of still another bit error detection method according to an embodiment of this application.

FIG. 4 is a schematic flowchart of still another bit error detection method according to an embodiment of this application. The bit error detection method may be combined with the methods in the embodiments shown in FIG. 2, FIG. 3A, and FIG. 3B. When the methods shown in FIG. 2, FIG. 3A, and FIG. 3B are performed, the following steps may further be performed, which specifically include the following.

S401: Receive a first parity value collected by the sending device, where the first parity value indicates a quantity of blocks in the first to-be-checked bit stream.

S402: Collect a quantity of blocks in the received second to-be-checked bit stream and generate a second parity value.

S403: If the first result is the same as the third result and the first parity value is the same as the second parity value, determine that a bit error occurs when the first to-be-checked bit stream is transmitted; if the first result is different from the third result, the first result is different from the second result, and the second result is different from a predetermined result, determine that a bit error occurs; or if the first result is the same as the third result, and the first parity value is different from the second parity value, determine that no bit error occurs.

Optionally, when sending the first result to the receiving device, the sending device may transmit the parity value Numr indicating the quantity of blocks in the first to-be-checked bit stream together with the first result. The first result, that is, the BIPs, may be transmitted in independent 64B/64B, where one bit may be selected to transmit the Numr, and a specific position of this bit is not limited, provided that a 64B/66B block transmitting a BIP check result includes the Numr. The receiving device recalculates a BIP-8 value, and needs to check whether a received Numr is consistent with a collected parity value Numc indicating a quantity of blocks in the second to-be-checked bit stream.

When it is determined, based on comparison between the BIPd and the BIPs, and comparison between the BIPd and the third result, that an operation of adding or deleting a specific type of block is performed, it may be further determined, based on comparison between the Numr and the Numc, that the bit error actually occurs on the link, or that the bit error is indeed caused by addition or deletion of the block.

For example, at the receive end, after reversal of bit values at the second, third, fourth, and fifth bit positions in the BIPd, the BIPd is consistent with the BIPs, and it may be first determined that an operation of adding or deleting an odd quantity of idle/LPI blocks has been performed during data transmission. Then, this determining may be further confirmed. To be specific, it is further determined whether a bit error occurs at the second, third, fourth, and fifth bit positions during transmission.

(1) If the Numr is consistent with the Numc, that is, they are both of an odd quantity or an even quantity, it indicates that addition or deletion of an even quantity of idle or LPI blocks is not performed or has been performed (a correct situation) in a transmission process. To be specific, value inconsistency between the BIPd and the BIPs is caused by a bit error actually occurring on the link. Then, bit error collection is performed, the quantity of bit errors increases by one, and the quantity of received bits is accumulated to the total quantity of bits.

(2) If the Numr is inconsistent with the Numc, it indicates that an operation of adding or deleting an odd quantity of idle or LPI blocks has been performed in a transmission process. To be specific, value inconsistency between the BIPd and the BIPs is caused by addition or deletion of an idle or LPI block. No bit error occurs on the link. Therefore, bit error collection is not performed and only the total quantity of received bits is accumulated.

In this manner, it may be more accurately determined, based on considering impact of addition or deletion of a block on a BIP check result, whether a plurality of bit errors are caused by addition or deletion of a block, or actually occur on the link. This can perform bit error rate BER collection more accurately, and reflect a link status more truly.

FIG. 9 is a schematic diagram of composition of a bit error detection apparatus according to an embodiment of this application. The apparatus may be applied to an Ethernet port or switch, and may be implemented by upgrading hardware of a physical layer for an original switch or network interface card (including applying a new chip or loading new FPGA code). In this embodiment, the apparatus includes: a transceiver unit 100, configured to receive a first result obtained by a sending device by performing BIP check on a sent first to-be-checked bit stream; and a processing unit 200, configured to: perform BIP check on a received second to-be-checked bit stream to obtain a second result, where the second to-be-checked bit stream is a bit stream received by a receiving device after the first to-be-checked bit stream is transmitted; detect a type of a control block in the second to-be-checked bit stream, and determine a third result based on impact of the type of the control block on a BIP check result; compare the first result, the second result, and the third result; and if the first result is different from the second result, the first result is different from the third result, and the second result is different from a predetermined result, determine that a bit error occurs when the first to-be-checked bit stream is transmitted.

Optionally, the processing unit 200 is further configured to: if an invalid block or an error block is detected in the second to-be-checked bit stream, determine that a bit error occurs when the first to-be-checked bit stream is transmitted.

Optionally, the type of the control block includes a local fault block, a remote fault block, an idle block, and a low power idle block.

Optionally, the predetermined result is 00000000 or 01010010 if the processing unit 200 detects that the type of the control block in the second to-be-checked bit stream is the local fault block and the second to-be-checked bit stream is consecutive local fault blocks.

Optionally, the predetermined result is 00000000 or 10010010 if the processing unit 200 detects that the type of the control block in the second to-be-checked bit stream is the remote fault block and the second to-be-checked bit stream is consecutive remote fault blocks.

Optionally, that the processing unit 200 determines a third result based on impact of the type of the control block on a BIP check result is specifically configured to: if it is detected that the type of the control block in the second to-be-checked bit stream is the local fault block and a quantity of local fault blocks is 1, reverse bit values at the second, fourth, and seventh bit positions in the second result to obtain the third result.

Optionally, that the processing unit 200 determines a third result based on impact of the type of the control block on a BIP check result is specifically configured to: if it is detected that the type of the control block in the second to-be-checked bit stream is the remote fault block and a quantity of remote fault blocks is 1, reverse bit values at the first, fourth, and seventh bit positions in the second result to obtain the third result.

Optionally, that the processing unit 200 determines a third result based on impact of the type of the control block on a BIP check result is specifically configured to: if it is detected that the type of the control block in the second to-be-checked bit stream is the idle block or the low power idle block, reverse bit values at the second, third, fourth, and fifth bit positions in the second result to obtain the third result.

Optionally, the transceiver unit 100 is further configured to receive a first parity value collected by the sending device, where the first parity value indicates a quantity of blocks in the first to-be-checked bit stream; and the processing unit 200 is further configured to: collect a quantity of blocks in the received second to-be-checked bit stream and generate a second parity value; and if the first result is the same as the third result and the first parity value is the same as the second parity value, determine that a bit error occurs when the first to-be-checked bit stream is transmitted.

Optionally, after determining that a bit error occurs when the first to-be-checked bit stream is transmitted, the processing unit 200 is further configured to: accumulate a quantity of bit errors occurring in a preset time period, and calculate a bit error rate based on a total quantity of bit errors accumulated in the preset time period and a total quantity of received bits.

Optionally, the transceiver unit 100 is further configured to: send the total quantity of bit errors or the bit error rate to the sending device.

Figure 10:
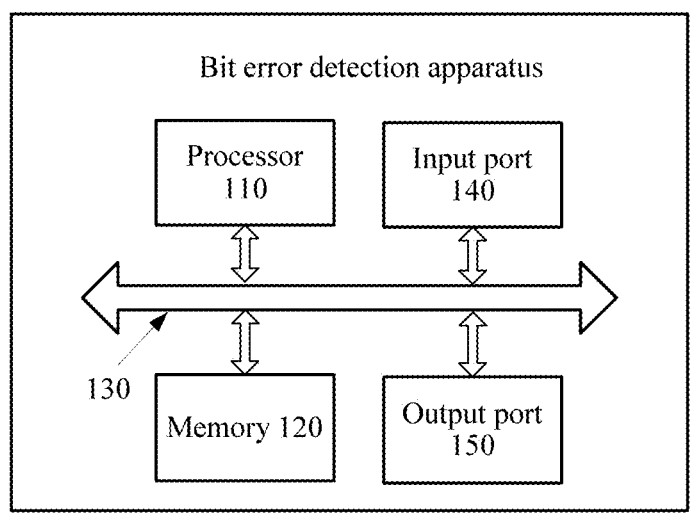
FIG. 10 is a schematic diagram of composition of another bit error detection apparatus according to an embodiment of this application.

FIG. 10 is a schematic diagram of composition of another bit error detection apparatus according to an embodiment of this application. The apparatus may include a processor 110, a memory 120, and a bus 130. The processor 110 is connected to the memory 120 by using the bus 130. The memory 120 is configured to store an instruction. The processor 110 is configured to execute the instruction stored in the memory 120, to implement the steps in the methods corresponding to FIG. 2 to FIG. 4.

Further, the apparatus may include an input port 140 and an output port 150. The processor 110, the memory 120, the input port 140, and the output port 150 may be connected by using the bus 130.

The processor 110 is configured to execute the instruction stored in the memory 120, to control the input port 140 to receive a signal, control the output port 150 to send a signal, and complete the steps performed by the apparatus in the foregoing methods. The input port 140 and the output port 150 may be a same physical entity or different physical entities. When the input port 140 and the output port 150 are the same physical entity, the input port 140 and the output port 150 may be collectively referred to as an input/output port. The memory 120 may be integrated into the processor 110, or may be separated from the processor 110.

In an implementation, functions of the input port 140 and the output port 150 may be implemented by using a transceiver circuit or a dedicated transceiver chip. The processor 110 may be implemented by using a dedicated processing chip, a dedicated processing circuit, a dedicated processor, or a universal chip.

In another implementation, the apparatus provided in this embodiment of this application may be implemented by using a general-purpose computer. To be specific, program code that is used to implement functions of the processor 110, the input port 140, and the output port 150 is stored in the memory. A general-purpose processor executes the code in the memory to implement the functions of the processor 110, the input port 140, and the output port 150.

For concepts, explanations, detailed descriptions, and other steps that are related to the technical solutions provided in the embodiments of this application and that are related to the apparatus, refer to the foregoing methods or descriptions about this content in other embodiments. Details are not described herein again.

A person skilled in the art may understand that, for ease of description, FIG. 10 shows only one memory and only one processor. Actually, a controller may include a plurality of processors and a plurality of memories. The memory may also be referred to as a storage medium, a storage device, or the like. This is not limited in this embodiment of this application.

It should be understood that in the embodiments of this application, the processor may be a central processing unit (CPU), or the processor may be another general-purpose processor, a digital signal processor (DSP), an application-specific integrated circuit (ASIC), a field programmable gate array (FPGA), or another programmable logic device, discrete gate or transistor logic device, discrete hardware component, or the like. The general-purpose processor may be a microprocessor, or the processor may be any conventional processor or the like.

The memory may include a read-only memory and a random access memory, and provide an instruction and data to the processor. A part of the memory may further include a non-volatile random access memory.

The bus may further include a power bus, a control bus, a status signal bus, and the like, in addition to a data bus. However, for clear description, various types of buses in the figure are marked as the bus.

In an implementation process, steps in the foregoing methods can be implemented by using a hardware integrated logic circuit in the processor, or by using instructions in a form of software. The steps of the methods disclosed with reference to the embodiments of this application may be directly performed by a hardware processor, or may be performed by using a combination of hardware in the processor and a software module. The software module may be located in a mature storage medium in the art, such as a random access memory, a flash memory, a read-only memory, a programmable read-only memory, an electrically erasable programmable memory, a register, or the like. The storage medium is located in the memory, and the processor reads information in the memory and completes the steps in the foregoing methods in combination with hardware of the processor. To avoid repetition, details are not described herein again.

Based on the methods provided in the embodiments of this application, an embodiment of this application further provides a bit error detection system. The bit error detection system includes the receiving device and the sending device described above. For specific composition and functions, refer to related descriptions in FIG. 1 and FIG. 9. Details are not described herein again.

It should be further understood that "first", "second", "third", "fourth", and various numerical symbols in this specification are merely used for differentiation for ease of description, and are not construed as a limitation on the scope of the embodiments of this application.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

A person of ordinary skill in the art may be aware that, in combination with illustrative logical blocks described in the embodiments disclosed in this specification and steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of this application are all or partially generated. The computer may be a general-purpose computer, a special-purpose computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive solid state disk (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method, comprising:
    receiving, by a receiving device, a first result, wherein the first result is obtained by a sending device by performing a first bit interleaving parity (BIP) check on a first to-be-checked bit stream that is sent by the sending device to the receiving device;
    receiving, by the receiving device, a second to-be-checked bit stream after the first to-be-checked bit stream is sent by the sending device, wherein the first to-be-checked bit stream is the same as the second to-be-checked bit stream, or one or more blocks are added to or deleted from the first to-be-checked bit stream during transmission of the first to-be-checked bit stream, to form the second to-be-checked bit stream that is received by the receiving device;
    performing, by the receiving device, a second BIP check on the second to-be-checked bit stream to obtain a second result;
    detecting, by the receiving device, a type of a control block comprised in the second to-be-checked bit stream;
    determining, by the receiving device, a third result based on impact of the type of the control block on the second result;
    comparing, by the receiving device, the first result, the second result, and the third result; and
    in response to determining that the first result is different from the second result, the first result is different from the third result, and the second result is different from a predetermined result, determining that a bit error occurred when the first to-be-checked bit stream was transmitted by the sending device.

2. The method according to claim 1, further comprising:
    in response to detecting an invalid block or an error block in the second to-be-checked bit stream, determining that a bit error occurred when the first to-be-checked bit stream was transmitted by the sending device.

3. The method according to claim 1, wherein the type of the control block is a local fault block type, a remote fault block type, an idle block type, or a low power idle block type.

4. The method according to claim 3, wherein the predetermined result is 00000000 or 01010010 when it is detected that the type of the control block in the second to-be-checked bit stream is the local fault block type and the second to-be-checked bit stream comprises consecutive local fault blocks.

5. The method according to claim 3, wherein the predetermined result is 00000000 or 10010010 when it is detected that the type of the control block in the second to-be-checked bit stream is the remote fault block type and the second to-be-checked bit stream comprises consecutive remote fault blocks.

6. The method according to claim 3, wherein determining the third result based on the impact of the type of the control block on the second result comprises:
    in response to detecting that the type of the control block in the second to-be-checked bit stream is the local fault block type and a quantity of local fault blocks in the second to-be-checked bit stream is 1, reversing bit values at second, fourth, and seventh bit positions in the second result, to obtain the third result.

7. The method according to claim 3, wherein determining the third result based on impact of the type of the control block on the second result comprises:
    in response to detecting that the type of the control block in the second to-be-checked bit stream is the remote fault block type and a quantity of remote fault blocks in the second to-be-checked bit stream is 1, reversing bit values at first, fourth, and seventh bit positions in the second result, to obtain the third result.

8. The method according to claim 3, wherein determining the third result based on the impact of the type of the control block on the second result comprises:
    in response to detecting that the type of the control block in the second to-be-checked bit stream is the idle block or the low power idle block, reversing bit values at second, third, fourth, and fifth bit positions in the second result, to obtain the third result.

9. The method according to claim 1, further comprising:
receiving a first parity value collected by the sending device, wherein the first parity value indicates a quantity of blocks in the first to-be-checked bit stream;
collecting a quantity of blocks in the second to-be-checked bit stream, and generating a second parity value; and
in response to determining the first result is the same as the third result and the first parity value is the same as the second parity value, determining that a bit error occurred when the first to-be-checked bit stream was transmitted.

10. The method according to claim 1, further comprising:
after determining that a bit error occurred when the first to-be-checked bit stream was transmitted, accumulating a quantity of bit errors occurring in a preset time period;
calculating a bit error rate based on a total quantity of bit errors accumulated in the preset time period and a total quantity of received bits; and
sending the total quantity of bit errors or the bit error rate to the sending device.

11. An apparatus, comprising:
a transceiver, configured to:
receive a first result, wherein the first result is obtained by a sending device by performing first bit interleaving parity (BIP) check on a first to-be-checked bit stream that is sent by the sending device to the apparatus; and
receive a second to-be-checked bit stream after the first to-be-checked bit stream is sent by the sending device, wherein the first to-be-checked bit stream is the same as the second to-be-checked bit stream, or one or more blocks are added to or deleted from the first to-be-checked bit stream during transmission of the first to-be-checked bit stream, to form the second to-be-checked bit stream that is received by the apparatus;
a processor; and
a non-transitory computer-readable storage medium storing a program to be executed by the processor, the program including instructions for:
performing a second BIP check on the second to-be-checked bit stream, to obtain a second result;
detecting a type of a control block in the second to-be-checked bit stream; and
determining a third result based on impact of the type of the control block on the second result;
comparing the first result, the second result, and the third result; and
in response to the first result being different from the second result, the first result being different from the third result, and the second result being different from a predetermined result, determine that a bit error occurred when the first to-be-checked bit stream was transmitted.

12. The apparatus according to claim 11, wherein the type of the control block is a local fault block type, a remote fault block type, an idle block type, or a low power idle block type.

13. The apparatus according to claim 12, wherein the predetermined result is 00000000 or 01010010 when it is detected that the type of the control block in the second to-be-checked bit stream is the local fault block type and the second to-be-checked bit stream comprises consecutive local fault blocks.

14. The apparatus according to claim 12, wherein the predetermined result is 00000000 or 10010010 when it is detected that the type of the control block in the second to-be-checked bit stream is the remote fault block type and the second to-be-checked bit stream comprises consecutive remote fault blocks.

15. The apparatus according to claim 12, wherein determining the third result based on the impact of the type of the control block on the second result comprises:
when it is detected that the type of the control block in the second to-be-checked bit stream is the local fault block type and a quantity of local fault blocks in the second to-be-checked bit stream is 1, reversing bit values at second, fourth, and seventh bit positions in the second result, to obtain the third result.

16. The apparatus according to claim 12, wherein determining the third result based on the impact of the type of the control block on the second result comprises:
when it is detected that the type of the control block in the second to-be-checked bit stream is the remote fault block type and a quantity of remote fault blocks in the second to-be-checked bit stream is 1, reversing bit values at first, fourth, and seventh bit positions in the second result, to obtain the third result.

17. The apparatus according to claim 12, wherein determining the third result based on the impact of the type of the control block on the second result comprises:
when it is detected that the type of the control block in the second to-be-checked bit stream is the idle block type or the low power idle block type, reversing bit values at second, third, fourth, and fifth bit positions in the second result, to obtain the third result.

18. The apparatus according to claim 11, wherein the transceiver is further configured to:
receive a first parity value collected by the sending device, wherein the first parity value indicates a quantity of blocks in the first to-be-checked bit stream; and
wherein the program further includes instructions for:
collecting a quantity of blocks in the second to-be-checked bit stream;
generating a second parity value; and
when the first result is the same as the third result and the first parity value is the same as the second parity value, determining that a bit error occurs when the first to-be-checked bit stream was transmitted.

19. The apparatus according to claim 11, wherein the program further includes instructions for:
accumulating a quantity of bit errors occurring in a preset time period, and calculating a bit error rate based on a total quantity of bit errors accumulated in the preset time period and a total quantity of received bits; and
sending the total quantity of bit errors or the bit error rate to the sending device.

20. A non-transitory computer readable storage medium storing a program executable by at least one processor, the program including instructions for:
receiving a first result, wherein the first result is obtained by a sending device by performing first bit interleaving parity (BIP) check on a first to-be-checked bit stream that is sent by the sending device;
receiving a second to-be-checked bit stream after the first to-be-checked bit stream is sent by the sending device, wherein the first to-be-checked bit stream is the same as the second to-be-checked bit stream, or one or more blocks are added to or deleted from the first to-be-checked bit stream during transmission of the first to-be-checked bit stream, to form the second to-be-checked bit stream that is received;
performing second BIP check on the second to-be-checked bit stream to obtain a second result;
detecting a type of a control block in the second to-be-checked bit stream;
determining a third result based on impact of the type of the control block on the second result;
comparing the first result, the second result, and the third result; and
in response to determining the first result is different from the second result, the first result is different from the third result, and the second result is different from a predetermined result, determining that a bit error occurred when the first to-be-checked bit stream was transmitted.

\* \* \* \* \*